Jan. 15, 1963

D. C. SKILLEN
TRANSISTOR SWITCHING CIRCUIT WITH
STABILIZED LEAKAGE CURRENT PATH
Filed March 25, 1960

3,073,969

DAWSON C. SKILLEN,
INVENTOR.

BY
Barkelew & Lewis

United States Patent Office 3,073,969

Patented Jan. 15, 1963

3,073,969

TRANSISTOR SWITCHING CIRCUIT WITH STABILIZED LEAKAGE CURRENT PATH

Dawson C. Skillen, Covina, Calif., assignor to Giannini Controls Corporation, Pasadena, Calif., a corporation of New York Filed Mar. 25, 1960, Ser. No. 17,561
5 Claims. (Cl. 307—88.5)

Figure 1:
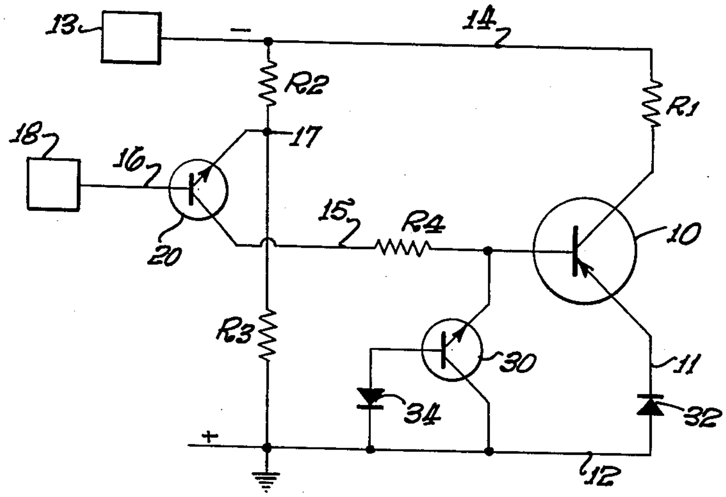

This invention has to do with improved switching circuits which utilize a power transistor and means for shifting the same between conducting and cut-off conditions. A known advantage of such switching circuits is that relatively little power is required for their operation.

However, when a power transistor is cut off, the current in its output circuit does not ordinarily go to zero, but decreases only to a value that is determined fundamentally by the reverse current characteristic of its collector diode. If any appreciable part of that reverse or leakage current is allowed to pass between the base and emitter of the power transistor, it causes enhanced conduction at the collector diode. Under certain operating conditions, particularly at elevated temperatures, that effect tends to become cumulative, and may produce "thermal runaway" and consequent malfunction of the circuit or destruction of the components.

The present invention avoids such difficulties by providing in the base circuit a particularly effective current path by which the leakage current at the collector diode of the power transistor is conducted through the base terminal, and thus prevented from reaching the emitter junction to any significant extent.

A particular advantage of the leakage current path provided by the invention is that it adds relatively little to the power drain on the control circuit that is employed to switch the power transistor on. That is accomplished by utilizing an auxiliary transistor in the leakage current path, and by controlling the current through the auxiliary transistor in such a way that it does not increase significantly when the power transistor is switched on. An illustrative circuit for controlling the auxiliary transistor in that way utilizes a semiconductor diode so connected that the current passed by the auxiliary transistor varies directly with the reverse current through the diode. The inherent stability of that reverse current tends to stabilize the auxiliary transistor current against the shift in its supply voltage that typically accompanies switching of the power transistor.

A further important advantage of the invention is the provision of a leakage current path for a power transistor in which the conductivity automatically increases with temperature in such a way as to substantially compensate the leakage current increase. That is typically accomplished by selecting a diode, for controlling the input current to the auxiliary transistor, which has temperature characteristics similar to those of the collector diode of the power transistor.

In accordance with a further aspect of the invention, the power drain on the power transistor switching circuit due to provision of the leakage current path is not only held to a moderate value, but is made substantially zero. For that purpose the invention provides a coupling circuit by which the control signal employed for switching on the power transistor also acts to cut off conduction through the auxiliary transistor.

A full understanding of the invention, and of its further objects and advantages, will be had from the following description of illustrative circuitry by which it may be carried out. The particulars of that description, and of the drawings which form a part thereof, are intended only as illustration of the invention, and not as a limitation upon its scope, which is defined in the appended claims.

Figure 2:
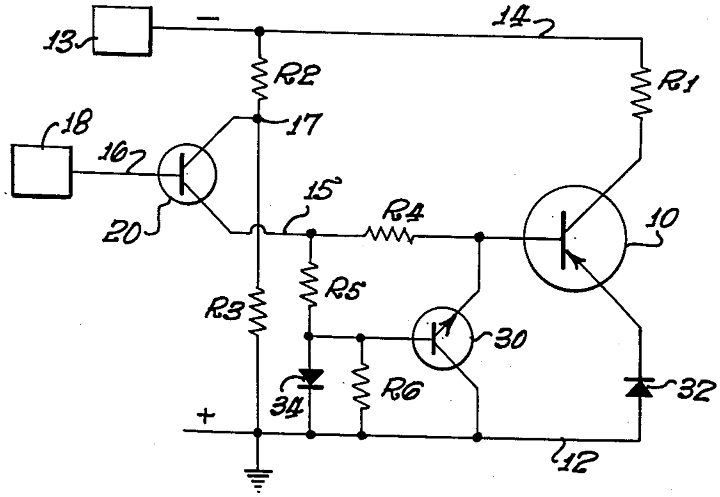

In the drawings:

FIG. 1 is a schematic diagram representing an illustrative embodiment of the invention; and FIG. 2 is a schematic drawing representing a modification.

In the illustrative system represented in the drawings, a power transistor is shown schematically at 10, connected in series with a load resistance R1 between two power conduits 12 and 14. Element R1 may represent a heating element, for example, or the operating impedance of any control, indicating or actuating device that is to be controlled by the power transistor. As shown, transistor 10 is a pnp junction transistor with its emitter connected via the line 11 to the grounded power line 12 and its collector connected via load resistance R1 to the relatively negative power line 14. A source of negative power is represented schematically at 13. The polarity of lines 12 and 14 may be interchanged, with accompanying interchange of npn and pnp transistors. The system to be described may also be utilized with alternating current power, when it will function during the appropriate half of each cycle.

The base of transistor 10 is connected via the line 15 to a control device, represented illustratively as the control transistor 20. A current limiting resistance R4 is connected in line 15.

Control transistor 20 is shown as a junction transistor of npn type with its collector connected to line 15 and its emitter connected to the junction 17 of the two resistances R2 and R3, which are connected as a voltage divider between power lines 12 and 14. The transistor base is connected via the line 16 to a suitable device, represented schematically at 18, for developing a control signal. Device 18 may, for example, represent a bistable circuit of known type which produces on line 16 either an actuating signal voltage that is positive with respect to junction 17 and renders control transistor 20 strongly conductive, or an idling signal voltage that is negative with respect to junction 17 and cuts off the control transistor. Transistor 20 thus acts essentially as a switch, effectively connecting the base of power transistor 10 to junction 17 in response to an actuating signal and opening that connection in response to an idling signal. The voltage at junction 17 is typically sufficiently negative with respect to line 12 to drive power transistor 10 strongly conductive in presence of the actuating signal, applying virtually the entire supply voltage across load resistance R1. That negative voltage at junction 17, or the resulting current from the power transistor base to that junction, may be considered as constituting a control or actuating signal for the transistor. The action typically requires a supply of an appreciable power to line 15, and of a corresponding though smaller power to line 16; and it is desirable that the power requirement of both those control signals be held to a minimum.

When control transistor 20 is cut off, effectively opening line 15, power transistor 10 is effectively cut off, reducing the current through load resistance R1 to a low value. However, under that condition the power transistor is subjected to practically the entire line voltage. That ordinarily causes an appreciable flow of reverse or leakage current from the collector into the transistor base.

In accordance with one aspect of the invention, the base of power transistor 10 is connected to a power line 12 via the output circuit of an auxiliary transistor 30. As shown, transistor 30 is an npn transistor, and is thus of opposite type to the power transistor. The collector and emitter of the auxiliary transistor are connected directly to line 12 and to the power transistor base, respectively.

The base of auxiliary transistor 30 is connected via a suitable current regulating means to a source of voltage that is positive with respect to the emitter when power transistor 10 is cut off. Line 12 provides such a voltage, due to the base-to-emitter voltage of power transistor 10. Further bias for that purpose may be provided by inserting a suitable impedance in the emitter circuit of transistor 10. Such an impedance is indicated illustratively in the drawing as a semiconductor diode 32, connected in forward polarity. Diode 32 is preferably selected to provide a voltage drop that varies only slightly with the magnitude of the forward current and that is typically of the order of one volt. Such diodes are available commercially, for example, from Transitron Electronic Corp., under the trade name "Stabistor."

Any suitable type of current regulating means may be provided in the base circuit of auxiliary transistor 30. As shown illustratively, that current regulating means comprises the semiconductor diode 34, connected in reverse polarity, that is, connected so that its forward conduction is from the base of transistor 30 toward line 12. Current toward the transistor base is then limited by the reverse or leakage current transmitted by diode 34.

The reverse current in diode 34 has a value that is typically relatively independent of the magnitude of the voltage across the diode. Due to the relatively low forward resistance of the emitter diode of transistor 30, that voltage tends to equal the voltage between line 12 and the base of transistor 10. When transistor 10 is cut off, its base approaches the potential of line 12, but is held negative of that level by the reverse or leakage current transmitted by its collector-base diode. In the present circuit, overlooking the presence of R5 and R6 for the time being, that leakage current holds the base of transistor 10 sufficiently negative to maintain conduction in auxiliary transistor 30. The latter conduction is limited by diode 34 to a current value essentially equal to the diode reverse current multiplied by the current amplification of transistor 30. By suitable selection of components, the auxiliary transistor current is preferably made at least approximately equal to the power transistor leakage current. That leakage then draws little or no current through the emitter circuit of the power transistor, effectively preventing current build-up in the latter.

When the power transistor is switched on, the voltage difference between its base and line 12 is increased, for example from a fraction of a volt to 5 or 10 volts; and that voltage is applied across auxiliary transistor 30. However, current in the latter is still held to the low value determined by diode 34. Hence, only that relatively slight power drain is imposed upon the control signal on line 15.

It is ordinarily preferred to select diode 34 to have a reverse current that varies with temperature in approximately the same manner as the power transistor leakage current. The substantially proportional action of auxiliary transistor 30 then causes the above described compensation of leakage current to apply over a wide range of temperature variation. For that purpose, diode 34 and power transistor 10 are preferably mounted in effective thermally conductive relation, so that their temperatures will substantially correspond at all times. In particular, the normal temperature increase of the power transistor during periods of conduction will then warm the diode substantially equally; and both elements will cool at substantially equal rates when the power transistor is cut off.

It is sometimes desirable to supply to the power transistor base somewhat more current than is provided by the above described control action of diode 34. For example, it may not be feasible to provide sufficient heat conduction to maintain the diode at the transistor temperature as the latter warms up; or the temperature characteristic of the transistor leakage current may not be fully compensated by that of the diode reverse current. For that purpose, the simple current path through diode 34 may be replaced by a more complex control network of suitable type. FIG. 2 illustrates a modified circuit in which the resistance R6 provides an additional current path in parallel with diode 34 in the input circuit of the auxiliary transistor. R6 may be considered to represent any suitable type of circuit network with which the diode is incorporated to give a desired type of response to such variable factors as temperature. With that network as illustratively shown, resistance R6 is typically selected to add relatively little to the diode current at low applied voltages, that is, when the leakage current in the power transistor has a low or normal value. But as the applied voltage increases with increased leakage current, the current in R6 may dominate, since it increases in proportion to the voltage while the diode reverse current is essentially independent of voltage. It will be understood that design of a network such as R6 must take account of the power load imposed on the control signal supplied via line 15 to the power transistor.

FIG. 2 also illustrates a further aspect of the invention, whereby that power load is reduced substantially to zero. That may be accomplished by providing a coupling circuit by which the actuating signal, taken from line 15, for example, switches auxiliary transistor 30 to non-conductive condition. Such a coupling circuit is represented in the present embodiment by the resistance R5 acting in combination with resistance R4. R5 is connected between the base of auxiliary transistor 30 and the portion of line 15 between R4 and control transistor 20. In presence of an actuating signal on line 15, the signal current to the power transistor produces a voltage drop in R4, making the left end of R4 negative with respect to the right end as seen in the drawing. That negative voltage is transmitted via R5 to the base of auxiliary transistor 30, making it more negative than the emitter, and thus cutting off the transistor. The relatively small current flowing from line 15 via R5 thus replaces the much larger current that would otherwise be drawn by the collector-emitter circuit of auxiliary transistor 30. Even when R6 is present and has a value as low as 1000 ohms, for example, the current required in R5 is small compared to the signal current drawn by the power transistor; and when R6 is omitted, the current in R5 can be made virtually negligible.

As an illustrative example, when the power transistor requires a signal current of about 20m A., typical values of R4, R5 and R6 may be about 700 ohms, 5000 ohms and 1000 ohms, respectively. The current drawn by the coupling circuit is then typically about $\frac{1}{10}$ of the signal current. As R6 is increased in value, R5 may be increased nearly in proportion, up to a value such as 50,000 ohms, for example, at which the power requirements of the coupling circuit are effectively negligible.

I claim:

1. In combination with a power transistor and switching means for selectively supplying a control signal to the power transistor to shift the same between conductive and cut-off conditions; circuit means for conducting through the transistor base the reverse current that flows between the collector and base of the transistor when the latter is cut off, said circuit means comprising an auxiliary transistor having its output circuit connected to the power transistor in shunt to said switching circuit means, an input circuit for supplying a control current to the auxiliary transistor, and means in said input circuit for maintaining the control current substantially independent of the condition of the switching means.

2. The combination defined in claim 1, and including also coupling circuit means acting under control of the switching circuit means to supply a control signal to the auxiliary transistor when the power transistor is conductive, the last mentioned control signal acting to cut off conduction in the auxiliary transistor.

3. In combination, a power transistor having a base and having a collector and an emitter connected in a load circuit, switching circuit means for selectively supplying a control signal to the base of the power transistor to shift the same between conductive and cut-off conditions, an auxiliary transistor having an input circuit and an output circuit, said output circuit being connected to the base of the power transistor in shunt to the switching circuit means in such polarity that current in the output circuit tends to prevent conduction in the power transistor, and a semiconductor diode connected in the input circuit of the auxiliary transistor in such polarity that reverse current in the diode tends to render the auxiliary transistor conductive.

4. In combination, a power transistor having a base and having a collector and an emitter connected in a load circuit, switching circuit means for selectively supplying a control signal to the base of the power transistor to shift the same between conductive and cut-off conditions, auxiliary circuit means connected between the base and emitter of the power transistor, said auxiliary circuit means normally conducting a current that is substantially equal to the reverse current that flows between the collector and base of the transistor when the latter is cut off, and means acting in response to said control signal for rendering the auxiliary circuit means substantially non-conductive when the power transistor is conductive.

5. In combination, a power transistor having its emitter connected to ground and its collector connected through a load impedance to a source of electrical power, switching circuit means for selectively supplying a control signal to the base of the power transistor to shift the same to conductive condition, impedance means series connected between the switching circuit means and the transistor base, an auxiliary transistor having an input circuit and an output circuit, said output circuit being connected between the emitter and base of the power transistor in shunt to the switching circuit means and impedance means, and coupling circuit means connected between the switching circuit means and the base of the auxiliary transistor, said coupling circuit means acting in response to presence of a control signal to cut off conduction in the auxiliary transistor independently of the input circuit thereof.

References Cited in the file of this patent

UNITED STATES PATENTS 2,892,165 Lindsay -------------- June 23, 1959